United States Patent
Jeon

(10) Patent No.: US 7,764,100 B2
(45) Date of Patent: Jul. 27, 2010

(54) DFLOP CIRCUIT FOR AN EXTERNALLY ASYNCHRONOUS-INTERNALLY CLOCKED SYSTEM

(75) Inventor: Seon-Kwang Jeon, Ichon (KR)

(73) Assignee: Hynix Semiconductor Inc. (KR)

( * ) Notice: Subject to any disclaimer, the term of this patent is extended or adjusted under 35 U.S.C. 154(b) by 54 days.

(21) Appl. No.: 12/171,238

(22) Filed: Jul. 10, 2008

(65) Prior Publication Data

US 2009/0121745 A1    May 14, 2009

(30) Foreign Application Priority Data

Nov. 12, 2007    (KR) .................... 10-2007-0114945

(51) Int. Cl.
*H03K 3/00* (2006.01)
(52) U.S. Cl. .................... 327/200; 327/218; 327/203; 326/95; 326/113
(58) Field of Classification Search .................... 326/93, 326/95, 98, 113; 327/200–218
See application file for complete search history.

(56) References Cited

U.S. PATENT DOCUMENTS

| | | | | |
|---|---|---|---|---|
| 5,760,609 A | * | 6/1998 | Sharpe-Geisler | 326/93 |
| 5,767,718 A | * | 6/1998 | Shih | 327/228 |
| 5,892,373 A | * | 4/1999 | Tupuri et al. | 326/97 |
| 6,104,213 A | * | 8/2000 | Dhong et al. | 326/98 |
| 6,999,368 B2 | | 2/2006 | Fujimoto et al. | |
| 2005/0083093 A1 | * | 4/2005 | Rhee | 327/218 |
| 2007/0229133 A1 | * | 10/2007 | Tam et al. | 327/218 |
| 2008/0106315 A1 | * | 5/2008 | Jau et al. | 327/200 |

FOREIGN PATENT DOCUMENTS

| | | |
|---|---|---|
| JP | 03139010 | 6/1991 |
| JP | 2003-004813 | 1/2003 |
| JP | 2004007821 | 1/2004 |
| KR | 1020010048986 A | 6/2001 |
| KR | 200273008 | 4/2002 |

* cited by examiner

*Primary Examiner*—Vibol Tan
(74) *Attorney, Agent, or Firm*—Baker & McKenzie LLP

(57) ABSTRACT

A DFLOP circuit for an EAIC system includes a resolver. The resolver includes a signal transmission controller that is activated under the control of an internal clock signal to receive and transmit an input signal, and a precharge unit that is activated in response to the internal clock signal to precharge an output node of the signal transmission controller.

12 Claims, 6 Drawing Sheets

DFLOP CIRCUIT FOR AN EXTERNALLY ASYNCHRONOUS-INTERNALLY CLOCKED SYSTEM

CROSS-REFERENCES TO RELATED APPLICATION

The present application claims priority under 35 U.S.C. 119(a) to Korean application number 10-2007-0114945, filed in the Korean Intellectual Property office on Nov. 12, 2007, which is incorporated by reference in its entirety as if set forth in full.

BACKGROUND

1. Technical Field

The embodiments described herein relate to a DFLOP circuit, and in particular, to a DFLOP circuit that is used in an EAIC (Externally asynchronous-internally clocked) system, which internally generates a clock signal in an asynchronous system.

2. Related Art

Recently, restrictions inherent in conventional asynchronous circuits and new challenges for timing detection present by conventional semiconductor devices, a system that externally operates in an asynchronous manner but internally operates based on a clock signal, that is in a synchronous manner, has been introduced. Such a system is called an EAIC (Externally Asynchronous-Internally Clocked) system. In an EAIC system, when viewed from outside the device, only an external output signal, which responds to an external input signal, seems to be present, but actually an internal clock signal is generated on the basis of the input signal.

A DFLOP is used for a shift register in the EAIC system. FIGS. 1 and 2 are a conceptual view and a block diagram of a conventional DFLOP. The DFLOP of FIGS. 1 and 2 operates similarly to a D flip-flop, except that if a signal transmission operation is completed, then a ready signal R is generated to inform that the DFLOP is ready to execute a new operation.

Referring to FIGS. 1 and 2, the DFLOP includes a resolver 10, a metastable detection stage (MDS) 20, a latch 30, and a ready signal generator 40.

First, the resolver 10 is a flip-flop type logic for defining operation conditions according to an input signal. The resolver 10 receives an input signal 'in' and an internally generated internal clock signal 'CLK', and generates first output signals 'Y0' and 'Y1'. Specifically, if the internal clock signal 'CLK' is at a low level, then the resolver 10 generates the first output signals 'Y0' and 'Y1' at high level, regardless of the input signal 'in'. When the internal clock signal 'CLK' is changed to a high level, then the resolver 10 generates the first output signals 'Y0' and 'Y1' according to the input signal 'in'. The detailed structure and operation of the resolver 10 will be described below.

The MDS 20 generates second output signals 'Y0'' and 'Y1'' in response to the first output signals 'Y0' and 'Y1'. The MDS 20 functions to remove metastable components in the input signals. That is, the first output signals 'Y0' and 'Y1' are not provided as the second output signals 'Y0'' and 'Y1'' until after they are completely changed, for example, from low level to high level. Accordingly, the logic is implemented such that the signals are transmitted after the levels of the input signals are completely changed, thereby removing the metastable states of the output signals.

The latch 30 receives the second output signals 'Y0'' and 'Y1'', and supplies final output signals 'Q' and '/Q'. The latch 30 includes, for example, an RS flip-flop. If the latch 30 includes, e.g., a NOR type RS flip-flop, then the latch 30 operates in response to an input signal at a high level. Meanwhile, if the latch 30 includes, e.g., a NAND type RS flip-flop, then the latch 30 operates in response to an input signal at a low level. These may be selectively used depending on the purpose or structure of the DFLOP, and thus the general concept of the latch 30 will be described briefly herein.

The DFLOP further includes a ready signal generator 40. The ready signal generator 40 generates the ready signal 'R' on the basis of the second output signals 'Y0'' and 'Y1'' from the MDS 20. As described above, the ready signal 'R' informs that signal transmission is completed and it is ready to execute a next operation. The ready signal generator 40 includes a NAND gate ND that performs a NAND operation on the second output signals 'Y0'' and 'Y1'' to output the ready signal 'R'.

As such, in the DFLOP 1, the MDS 20 generates the ready signal 'R' after the signals are transmitted from the resolver 10. Accordingly, the metastable state can be excluded, and an internal stable operation can be implemented. In addition, the internal clock signal 'CLK' may be generated by combining the ready signals 'R' output from the DFLOP 1.

FIG. 3 is a circuit diagram of the resolver 10 shown in FIG. 2. Referring to FIG. 3, the resolver 10 includes an inverter IV1 and first to fourth NAND gates ND1 to ND4.

An input signal 'D' and an inverted signal of the input signal D generated by the inverter IV1 are supplied to the fourth NAND gate ND4 and the first NAND gate ND1, respectively.

The second and third NAND gates ND2 and ND3 receive the internal clock signal 'CLK' and are fed back with the output signals from the first and fourth NAND gates ND1 and ND4, respectively. Then, the second and third NAND gates ND2 and ND3 perform a NAND gate operation and supply the first output signals 'Y1' and 'Y0', respectively.

During the operation, when the internal clock signal 'CLK' is at a low level, the resolver 10 supplies the deactivated first output signals 'Y0' and 'Y1' at a high level. Then, if the internal clock signal 'CLK' is changed to a high level, then the resolver 10 supplies the first output signals 'Y0' and 'Y1' according to the input signal 'D'. For example, if the internal clock signal 'CLK' is at a high level and the input signal 'D' is at a high level, then the first positive output signal 'Y0' transitions to a low level opposite to the input signal D, and the first negative output signal 'Y1' transitions to a high level opposite to the first positive output signal 'Y0'. Meanwhile, if the internal clock signal 'CLK' is at a high level and the input signal 'D' is at a low level, then the first positive output signal 'Y0' transitions to a high level opposite to the input signal 'D', and the first negative output signal 'Y1' transitions to a low level opposite to the first positive output signal Y0.

However, for the resolver 10, the three-input NAND gates ND2 and ND3, the two-input NAND gates ND1 and ND4, and the inverter IV1 are needed. Specifically, since 11 PMOS transistors and 11 NMOS transistors are needed, the layout efficiency is poor. In addition, the response speed may be lowered due to the NAND gate operations with the feedback inputs.

SUMMARY

A DFLOP that is capable of realizing a fast response speed and improving the efficiency of a layout area is described herein.

According to one aspect, a DFLOP circuit includes a resolver. The resolver includes a signal transmission controller that is activated under the control of an internal clock signal to receive and transmit an input signal, and a precharge unit that is activated in response to the internal clock signal to precharge an output node of the signal transmission controller.

According to another aspect, a DFLOP circuit includes a resolve that includes a signal transmission controller that is activated in synchronization with a rising edge of an internal clock signal to transmit an input signal, a precharge unit that is activated in response to a first level of the internal clock signal to precharge an output node of the signal transmission controller to the first level, and an inversion unit that, according to a signal level of the internal clock signal, inverts a signal on the output node of the activated signal transmission controller or inverts a signal on an output node of the activated precharge unit.

According to still another aspect, a DFLOP includes a resolver that receives an input signal and supplies first and second output signals at opposite levels, while supplying the first and second output signals at the same level in synchronization with a rising edge of an internal clock signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

As described below, the embodiments described herein provide a DFLOP that comprises a reduction in the number of elements of a resolver in the DFLOP. As a result, a response speed can be increased, and the efficiency of a layout area can be improved.

Figure 4:
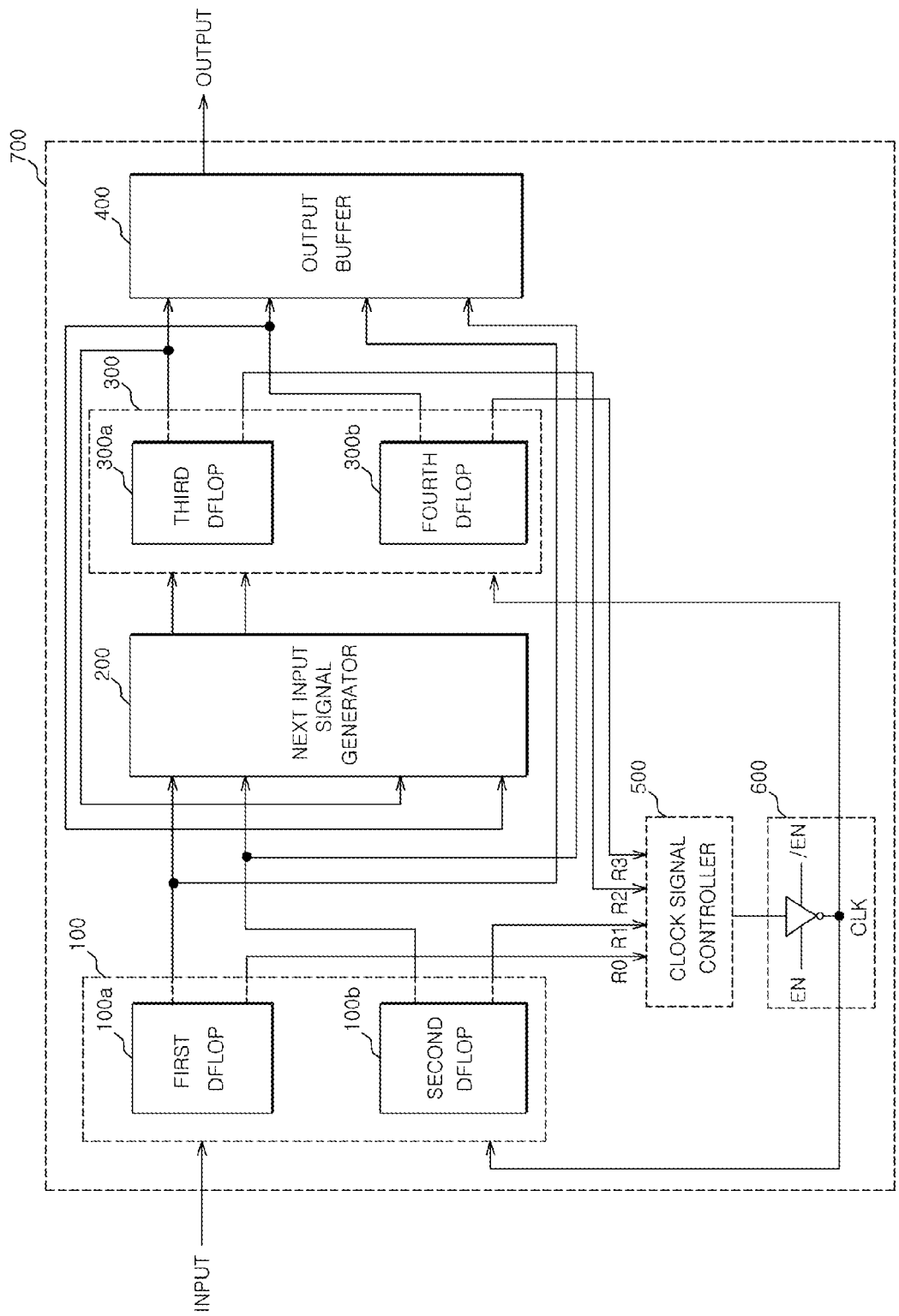
FIG. 4 is a block diagram of an EAIC system according to one embodiment.

FIG. 4 is a schematic block diagram of an EAIC system 700 according to an embodiment of the invention. Referring to FIG. 4, the EAIC system 700 can include a first shift register block 100, an input signal generator 200, a second shift register block 300, an output buffer 400, a clock signal controller 500, and a clock signal generator 600.

Specifically, the first shift register block 100 can include a first DFLOP 100a and a second DFLOP 100b. The first and second DFLOPs 100a and 100b can be configured to receive an external input signal 'INPUT' and transmit the received external input signal 'INPUT' to the next input signal generator 200. Subsequently, the first and second DFLOPs 100a and 100b can supply ready signals 'R0' and 'R1' to the clock signal controller 500, respectively.

The input signal generator 200 can be configured to generate signals, which are input signals of the second shift register block 300, on the basis of the signals from the first and second DFLOPs 100a and 100b.

Similarly to the first shift register block 100, the second shift register block 300 can include third and fourth DFLOPs 300a and 300b. The third and fourth DFLOPs 300a and 300b can be configured to receive the signals from the input signal generator 200 and transmit the received signals to the output buffer 400. In addition, third and fourth DFLOPs 300a and 300b can feed back the received signals to the input signal generator 200. Then, the input signal generator 200 can generate new signals and supply the generated signals to the second shift register block 300. Accordingly, the second shift register block 300 can continuously operate with different input signals. Meanwhile, if signal transmission is completed, then the third and fourth DFLOPs 300a and 300b can supply ready signals 'R2' and 'R3' to the clock signal controller 500.

The output buffer 400 can be configured to buffer the signals output from the first shift register block 100 and the second shift register block 300, and supply an external output signal 'OUTPUT'.

The first shift register block 100 and the second shift register block 300 can operate in synchronization with a clock signal, but the EAIC system 700 does not receive an external clock signal. That is, an internal clock signal 'CLK' is generated on the basis of internal operation signals, and then used in place of, e.g., external clock signal.

The clock signal controller 500 can be configured to receive the ready signals 'R0' to 'R3' and perform a logical operation. The clock signal generator 600 can be configured to process the result of the logical operation in the clock signal controller 500 in response to enable signals 'EN' and '/EN', and to generate the internal clock signal 'CLK'.

As mentioned, the EAIC system 700 can operate with the internal clock signal 'CLK', which is generated on the basis of the ready signals 'R0' to 'R3', instead of an external clock signal. The internal clock signal 'CLK' can be generated in based on the accurate delay time of the first and second shift register blocks 100 and 300. Therefore, a skew in the clock signal can be suppressed, and high speed operation can be achieved. In addition, the internal clock signal 'CLK' can be continuously generated while the external input signal 'INPUT' is applied.

In particular, the DFLOP configured according to the embodiments described herein can improve the area efficiency and increase the response speed, while supplying the same output signals as a conventional DFLOP with respect to the input signals.

For convenience of explanation, a detailed description will only be given for the structure and operation of the first DFLOP 100a, and descriptions of other DFLOPs will be omitted.

Figure 5A:
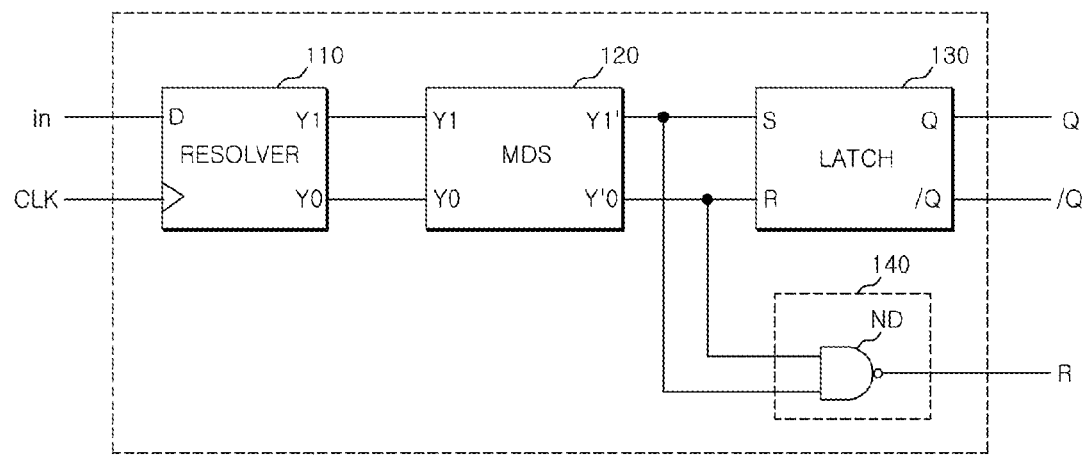
FIG. 5A is a conceptual view of a DFLOP that can be included in the system shown in FIG. 4.
Figure 5B:
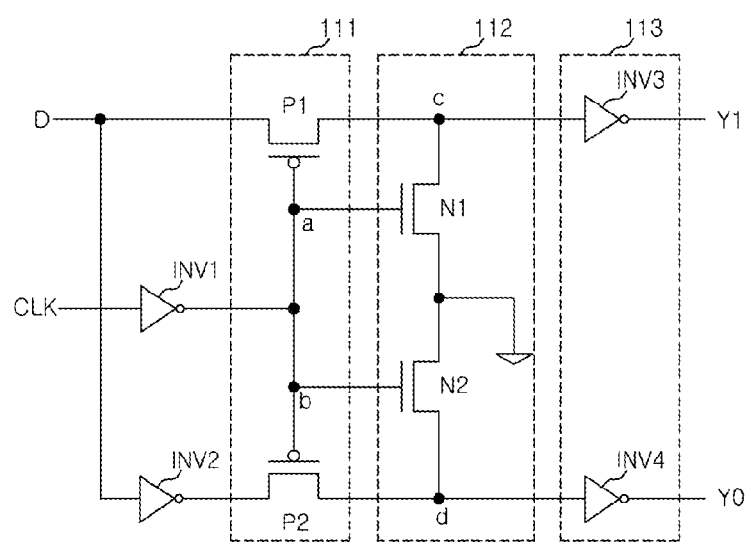
FIG. 5B is a circuit diagram of a resolver that can be included in the DFLOP shown in FIG. 5A.

FIG. 5A is a schematic block diagram of the first DFLOP 100a according to one embodiment. FIG. 5B is a detailed circuit diagram of a resolver 110 that can be included in the DFLOP 100A shown in FIG. 5A.

Referring to FIGS. 5A and 5B, the first DFLOP 100a can include a resolver 110, a metastable detection stage (MDS) 120, a latch 130, and a ready signal generator 140. The MDS 120, latch 130, and ready signal generator can be implemented in a manner similar to that used in a conventional DFLOP. Accordingly, descriptions of these elements will be omitted. Therefore, a description will be only given for the resolver 110.

Referring to FIG. 5B, the resolver 110 can include a signal transmission controller 111, a precharge unit 112, and an inversion unit 113.

Specifically, the signal transmission controller 111 can receive and transmit an input signal 'D' under the control of the internal clock signal 'CLK'. That is, the signal transmission controller 111 can be activated in response to a high level of the internal clock signal 'CLK' to transmit the input signal 'D'. The signal transmission controller 111 can include a first PMOS transistor P1 and a second PMOS transistor P2 serving as first and second transmission elements. The first PMOS transistor P1 can have a gate that receives an inverted signal of the internal clock signal 'CLK', a source that receives the input signal 'D', and a drain connected to a node (c). The second PMOS transistor P2 can have a gate that is connected to an inverted gate of the first PMOS transistor P1 to receive the inverted signal of the internal clock signal 'CLK', a source that receives an inverted signal of the input signal 'D', and a drain connected to a node (d).

The precharge unit 112 can be configured to precharge the node (c) and the node (d) to a low level when the internal clock signal 'CLK' is at a low level, such that first output signals 'Y0' and 'Y1' are constantly at a fixed high level. The precharge unit 112 can include first and second NMOS transistors N1 and N2. The first NMOS transistor N1 can have a gate connected to a node (a), a source connected to a ground voltage VSS, and a drain connected to the node (c). The second NMOS transistor N2 can have a gate connected to a node (b), a source connected to the ground voltage VSS, and a drain connected to the node (d).

When the internal clock signal 'CLK' is at a low level, the inversion unit 113 can invert the precharged levels of the nodes (c) and (d), and supply the obtained signals as the first output signals 'Y0' and 'Y1'. Meanwhile, when the internal clock signal 'CLK' is at a high level, the inversion unit 113 can invert the input signal 'D' and supply the inverted signal as the first output signals 'Y0' and 'Y1'. The inversion unit 113 can include third and fourth inverters INV3 and INV4. The third inverter INV3 can be configured to invert the level of the node (c). The fourth inverter INV4 can be configured to invert the level of the node (d).

Next, the operation of the resolver 110 will be described with reference to FIG. 5B. First, a case in which the internal clock signal 'CLK' is at a low level will be described.

If the internal clock signal 'CLK' is at a low level, then a signal at a high level inverted by the first inverter INV1 is transmitted to the signal transmission controller 111. Then, the first and second PMOS transistors P1 and P2 are turned off, and the first and second NMOS transistors N1 and N2 of the precharge unit 112 are turned on. Accordingly, the ground voltage VSS is supplied to the nodes (c) and (d). Therefore, the low level signals on the nodes (c) and (d) are supplied through the inversion unit 113 as the first output signals 'Y0' and 'Y1' at high level. That is, when the internal clock signal 'CLK' is at a low level, the resolver 110 supplies the first output signals 'Y0' and 'Y1' at a high level, regardless of the input signal 'D'.

Meanwhile, if the internal clock signal 'CLK' transitions from a low level to a high level, then a low level signal generated by the first inverter INV1 is transmitted to the signal transmission controller 111. That is, the first and second PMOS transistors P1 and P2 are turned on in synchronization with the rising edge of the internal clock signal 'CLK'. Accordingly, the input signal 'D' is transmitted to the node (c) through the first PMOS transistor P1, and the inverted signal of the input signal 'D' is transmitted to the node (d) through the second PMOS transistor P2. Since the nodes (a) and (b) are at a low level, the first and second NMOS transistors N1 and N2 of the precharge unit 112 are turned off. Therefore, the signals at opposite levels on the nodes (c) and (d) are inverted by the inversion unit 113, and the inverted signals are then supplied as the first output signals 'Y0' and 'Y1'.

Figure 1:
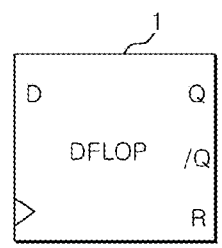
FIGS. 1 and 2 are a conceptual view and a block diagram of a conventional DFLOP.
Figure 2:
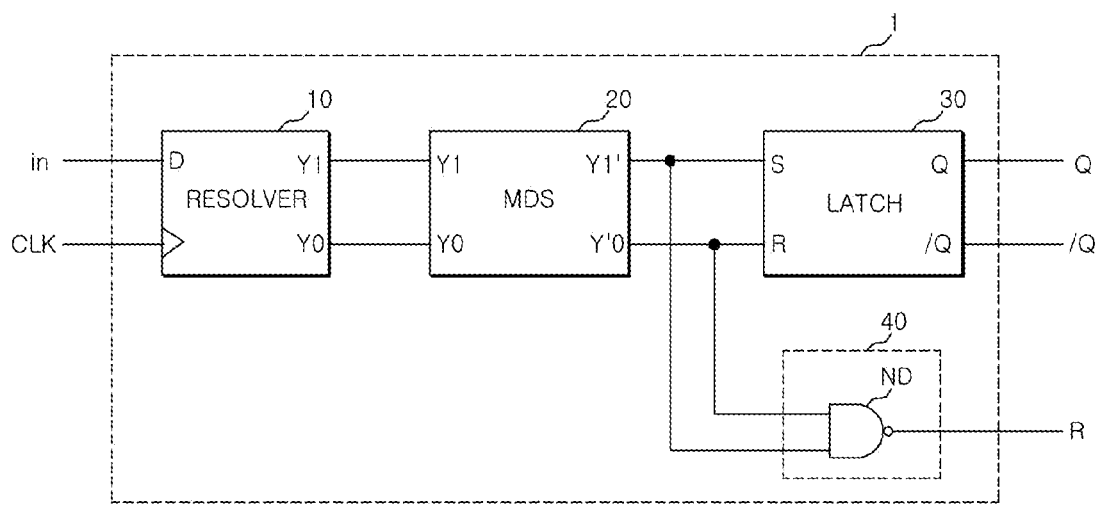
Figure 3:
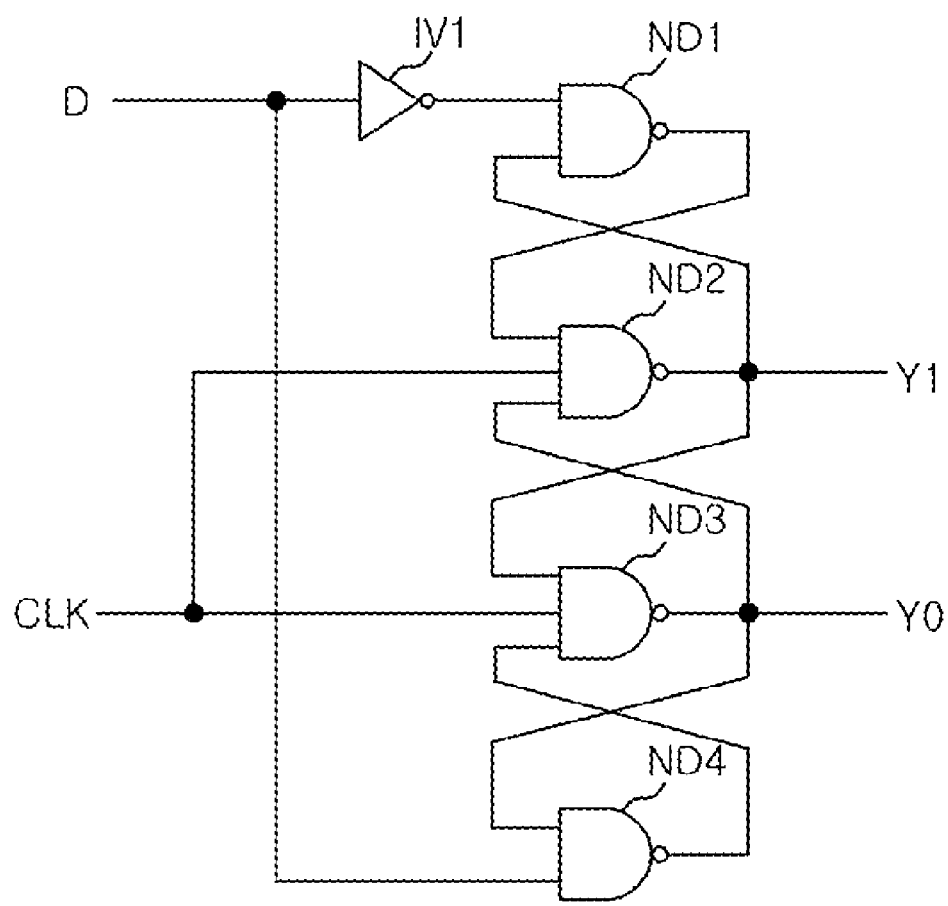
FIG. 3 is a circuit diagram of a resolver that can be included in the DFLOP shown in FIGS. 1 and 2.

As described above, the resolver 110 can be implemented as a circuit having the same function as the known resolver (see reference numeral 10 in FIG. 2). That is, the levels of the first output signals 'Y0' and 'Y1' are determined according to the level of the internal clock signal 'CLK'. If the internal clock signal 'CLK' is at a low level, then the first output signals 'Y0' and 'Y1' at a fixed high level are supplied, and if the internal clock signal 'CLK' is at a high level, then the first output signals 'Y0' and 'Y1' are supplied in response to the input signal 'D'. Specifically, instead of feedback logic, the precharge unit that performs a precharge operation in response to the low level internal clock signal 'CLK' is implemented. Therefore, the response speed can be increased, compared with a feedback logic implementation. As such, by modifying the logic so as to improve a portion to which a feedback signal is input in the known feedback logic, the response speed of the resolver 110 can be improved. In addition, by modifying the logic of the resolver 110, the number of transistors can be reduced. As a result, the efficiency of the layout area can be improved.

Figure 6:
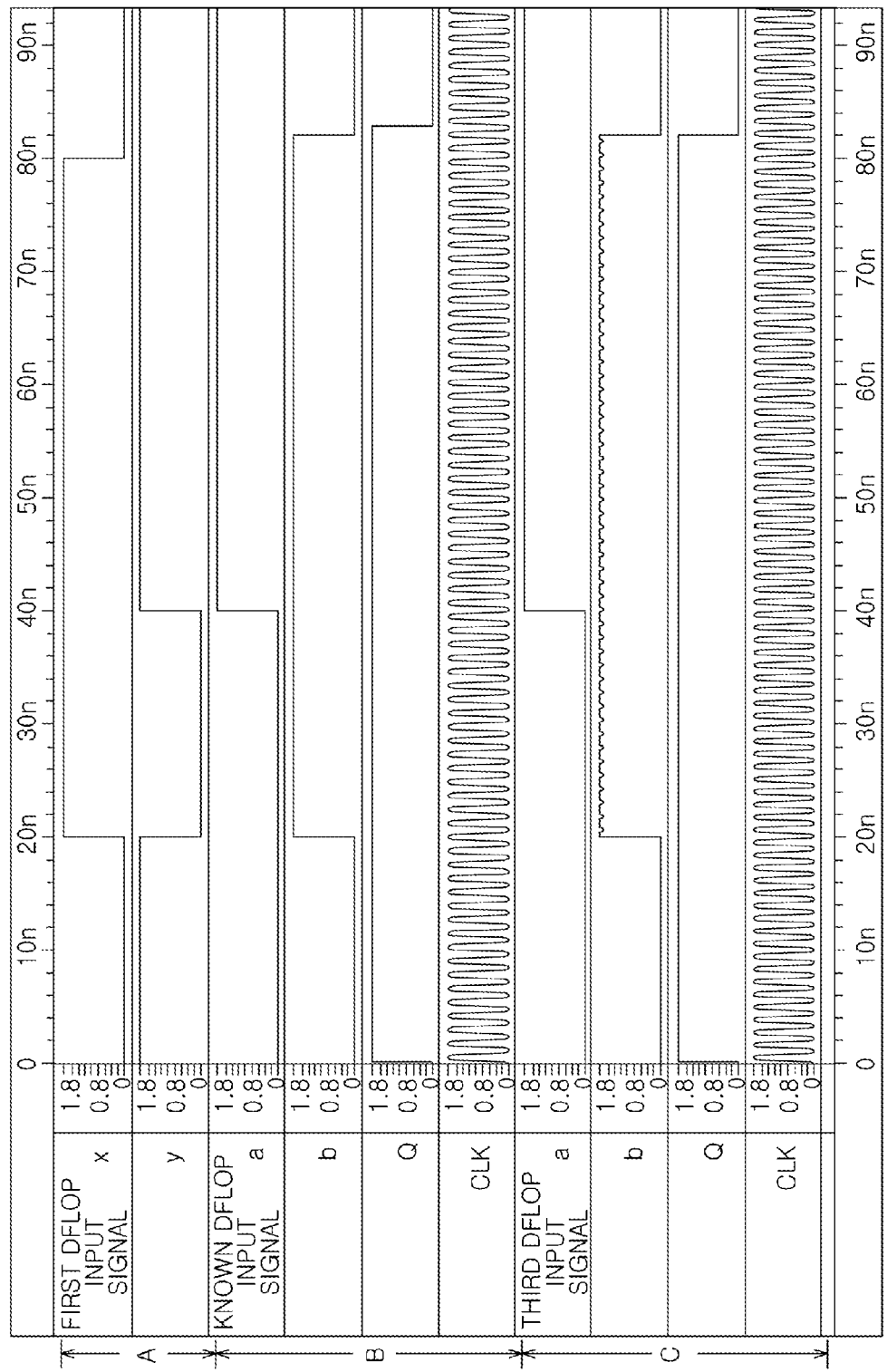
FIGS. 6 and 7 are simulation graphs comparing the operation waveforms of the DFLOP of FIGS. 1 and 2 and the DFLOP of FIGS. 5A and 5B.
Figure 7:
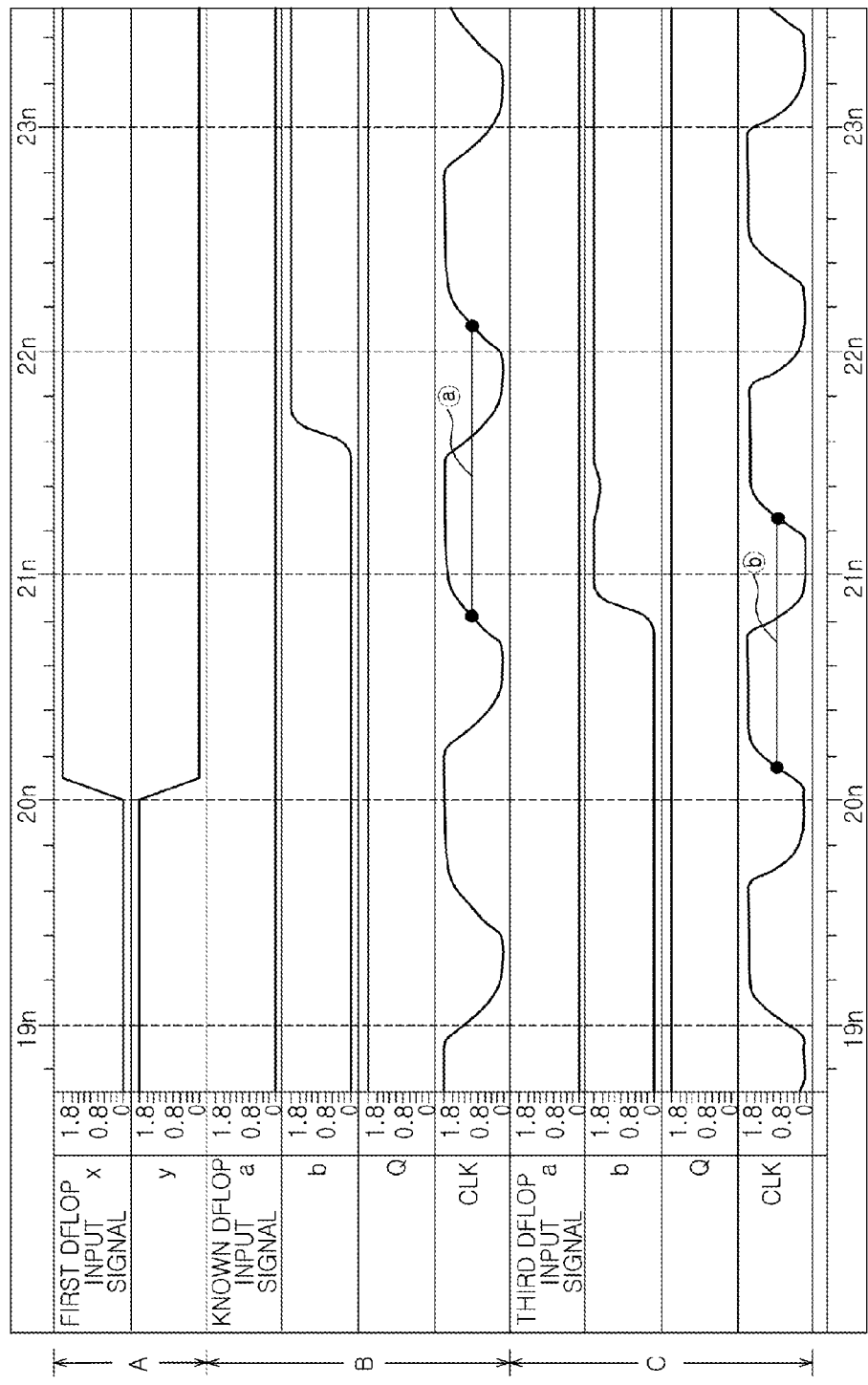

FIGS. 6 and 7 are simulation graphs illustrating the waveforms of the output signals of a conventional DFLOP and the DFLOP 110A shown in FIG. 5 with respect to the input signal. FIG. 7 is different from FIG. 6 in that the resolution of a clock domain is increased so as to measure the cycle of the internal clock signal 'CLK'.

Referring to FIGS. 6 and 7, a section A represents a case in which the input signal 'D' is applied at opposite levels. A section B represents the operation characteristic of a conventional DFLOP with respect to the input signal 'D'. A section C represents the operation characteristic of the DFLOP 110A. In the sections B and C, the DFLOP is illustrated as the DFLOP in the second shift register block 300.

Input signals 'x' and 'y' applied to the first shift register block (see reference numeral 100 in FIG. 4) are generated as new input signals 'a' and 'b' by the input signal generator (see reference numeral 200 in FIG. 4). Accordingly, the DFLOP in the sections B and C operates with the input signals 'a' and 'b' at different levels from the input signals in the section A. As shown in FIG. 6, it can be seen that the output signals of the DFLOP in the sections B and C have the same level.

Referring to FIG. 7, (a) represents the cycle of the internal clock signal 'CLK' generated in a conventional system, and (b) represents the cycle of the internal clock signal 'CLK' according to the embodiment of the invention. As shown in FIG. 7, while the cycle of the internal clock signal 'CLK' of a conventional system is approximately 1.3 ns, the cycle of the internal clock signal 'CLK' according to the embodiments described herein is approximately 1.12 ns. From this, it can be seen that the response speed of the clock cycle is improved 14%, compared with a conventional system.

As described above, it can be seen that the cycle of the internal clock signal 'CLK' according to the embodiments described herein is faster than the cycle of the internal clock signal 'CLK' of a conventional system. That is, in the DFLOP according to the embodiments described herein, by modifying the feedback logic of the resolver, the response speed of the transistor turned on according to the input is increased, and the internal clock signal 'CLK' is generated faster.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A flip-flop type DFLOP circuit for an Externally Asynchronous-Internally Clocked (EAIC) system that generates a ready signal, the DFLOP circuit comprising a resolver, the resolver including:
   a signal transmission controller that is activated under the control of an internal clock signal to receive and transmit an input signal; and
   a precharge unit that is activated in response to the internal clock signal to precharge an output node of the signal transmission controller,
   wherein the resolver further comprises an inversion unit configured to invert a signal on the output node of the signal transmission controller, and
   wherein the inversion unit is configured to invert a signal output from the signal transmission controller in response to a second level of the internal clock signal, and invert a signal precharged by the precharge unit in response to a first level of the internal clock signal.

2. The DFLOP circuit of claim 1, wherein the signal transmission controller comprises first and second transmission elements configured to receive and transmit the input signal and an inverted input signal, respectively.

3. The DFLOP circuit of claim 2, wherein the signal transmission controller is activated in synchronization with a rising edge of the internal clock signal to transmit signals at opposite levels by means of the first and second transmission elements.

4. The DFLOP circuit of claim 2, wherein the inversion unit comprises first and second inversion elements that are correspondingly connected to the first and second transmission elements.

5. The DFLOP circuit of claim 1, wherein the precharge unit is configured to precharge, in response to the first level of the internal clock signal, an input node of the inversion unit to the first level.

6. The DFLOP circuit of claim 1, wherein the first level and the second level are opposite to each other.

7. A flip-flop type DFLOP circuit for an EAIC system that generates a ready signal, the DFLOP circuit comprising a resolver, the resolver including:
   a signal transmission controller that is activated in synchronization with a rising edge of an internal clock signal to transmit an input signal;
   a precharge unit that is activated in response to a first level of the internal clock signal to precharge an output node of the signal transmission controller to the first level; and
   an inversion unit that, according to a signal level of the internal clock signal, is configured to invert a signal on the output node of the activated signal transmission controller or invert a signal on an output node of the activated precharge unit,
   wherein the inversion unit is configured to invert a signal output from the signal transmission controller in response to a second level of the internal clock signal, and invert a signal precharged by the precharge unit in response to a first level of the internal clock signal.

8. The DFLOP circuit of claim 7, wherein the signal transmission controller comprises first and second transmission elements configured to receive and transmit the input signal and an inverted input signal, respectively.

9. The DFLOP of claim 8, wherein the signal transmission controller is activated in synchronization with a rising edge of the internal clock signal to transmit signals at opposite levels by means of the first and second transmission elements.

10. The DFLOP circuit of claim 7, wherein the first level and the second level are opposite to each other.

11. The DFLOP circuit of claim 1, wherein:
   the signal transmission controller comprises:
      a first transistor having a gate receiving a inverted signal of the internal clock signal, a source receiving the input signal, and a drain connected to a first node, and
      a second transistor having a gate connected to the gate of the first transistor, a source receiving an inverted signal of the input signal, and a drain connected to a second node;
   the precharge unit comprises:
      a third transistor having a gate connected to the gate of the first transistor, a source connected to a ground voltage, and a drain connected to the first node, and
      a fourth transistor having a gate connected to the gate of the first transistor, a source connected to the ground voltage, and a drain connected to the second node; and
   the inversion unit comprises:
      a first inverter configured to invert a level of the first node, and
      a second inverter configured to invert a level of the second node.

12. The DFLOP circuit of claim 7, wherein:
   the signal transmission controller comprises:
      a first transistor having a gate receiving a inverted signal of the internal clock signal, a source receiving the input signal, and a drain connected to a first node, and
      a second transistor having a gate connected to the gate of the first transistor, a source received an inverted signal of the input signal, and a drain connected to a second node;
   the precharge unit comprises:
      a third transistor having a gate connected to the gate of the first transistor, a source connected to a ground voltage, and a drain connected to the first node, and
      a fourth transistor having a gate connected to the gate of the first transistor, a source connected to the ground voltage, and a drain connected to the second node, and
   the inversion unit comprises:
      a first inverter configured to invert a level of the first node, and
      a second inverter configured to invert a level of the second node.

* * * * *